United States Patent
Japp et al.

(10) Patent No.: US 6,534,179 B2
(45) Date of Patent: Mar. 18, 2003

(54) HALOGEN FREE TRIAZINES, BISMALEIMIDE/EPOXY POLYMERS, PREPREGS MADE THEREFROM FOR CIRCUIT BOARDS AND RESIN COATED ARTICLES, AND USE

(75) Inventors: Robert Maynard Japp, Vestal, NY (US); Konstantinos I. Papathomas, Endicott, NY (US); Mark D. Poliks, Vestal, NY (US)

(73) Assignee: International Business Machines Corporation, Armonk, NY (US)

( * ) Notice: Subject to any disclaimer, the term of this patent is extended or adjusted under 35 U.S.C. 154(b) by 9 days.

(21) Appl. No.: 09/818,458

(22) Filed: Mar. 27, 2001

(65) Prior Publication Data

US 2003/0003305 A1 Jan. 2, 2003

(51) Int. Cl.$^7$ ................................... B32B 27/04
(52) U.S. Cl. .................. 428/413; 428/378; 428/418; 528/408; 528/409; 525/523; 525/528; 523/452; 156/330; 156/330.9
(58) Field of Search ................ 428/413, 378, 428/418; 528/408, 409; 525/523, 528; 523/452; 427/220, 330, 330.9

(56) References Cited

U.S. PATENT DOCUMENTS

| | | | |
|---|---|---|---|
| 3,637,901 A | 1/1972 | Bargain et al. | 260/830 P |
| 3,730,948 A | 5/1973 | Aklyama et al. | 260/47 EC |
| 4,110,364 A | 8/1978 | Gaku et al. | 528/170 |
| 4,273,916 A | 6/1981 | Jones | 528/117 |
| 4,283,521 A | 8/1981 | Jones | 528/117 |
| 4,382,130 A | 5/1983 | Ellison et al. | 525/337 |
| 4,526,835 A | 7/1985 | Takahashi et al. | 428/413 |
| 4,644,039 A | 2/1987 | Boyd et al. | 525/422 |
| 4,774,282 A | 9/1988 | Qureshi | 524/606 |
| 5,442,039 A | 8/1995 | Hefner et al. | 528/422 |
| 5,639,808 A * | 6/1997 | Coggio et al. | 523/452 |
| 5,830,389 A | 11/1998 | Capote et al. | 252/512 |
| 5,837,771 A * | 11/1998 | Wipfelder et al. | 524/786 |
| 5,853,622 A | 12/1998 | Gallagher et al. | 252/512 |
| 5,922,397 A | 7/1999 | Brandt et al. | 427/98 |
| 5,948,533 A | 9/1999 | Gallagher et al. | 428/418 |
| 5,985,043 A | 11/1999 | Zhou et al. | 148/24 |
| 5,985,456 A | 11/1999 | Zhou et al. | 428/414 |
| 6,017,634 A | 1/2000 | Capote et al. | 428/414 |
| 6,337,375 B1 * | 1/2002 | Johansson et al. | 428/209 |

FOREIGN PATENT DOCUMENTS

| | | |
|---|---|---|
| EP | 409069 A | 1/1991 |
| JP | 55145765 A | 11/1980 |
| JP | 58222107 A | 12/1983 |
| JP | 59140279 A | 8/1984 |
| JP | 59179668 A | 10/1984 |
| JP | 62146927 A | 6/1987 |
| JP | 62285968 A | 12/1987 |
| JP | 5140526 A | 6/1993 |

\* cited by examiner

*Primary Examiner*—Robert Dawson
*Assistant Examiner*—Christopher M Keehan
(74) *Attorney, Agent, or Firm*—James A. Lucas; Driggs, Lucas, Brubaker & Hogg Co., LPA

(57) ABSTRACT

A halogen-free dielectric resin mixture is described for use in microvia and other similar applications. The resin mixture contains a cyanate ester monomer or prepolymer a bismaleimide, an epoxy and a flame inhibiting compound selected from the group consisting of a phosphinic acid anhydride, a phosphonic acid andydride and a phosphonic acid half-ester. The flame inhibitor is present in an amount wherein the elemental phosphorus content is between about 2% and about 20% by weight, based on the weight of the resin mixture. The resin mixture can also include one or more coloring, fluorescent and UV absorbing agents. Prepregs based on the resin mixture with inorganic or organic reinforcing agents, as well as circuit boards and chip carriers made from the prepregs are also described. A resin coated article for use in microvia laser applications is likewise included.

41 Claims, No Drawings

HALOGEN FREE TRIAZINES, BISMALEIMIDE/EPOXY POLYMERS, PREPREGS MADE THEREFROM FOR CIRCUIT BOARDS AND RESIN COATED ARTICLES, AND USE

FIELD OF THE INVENTION

This invention relates to dielectric materials, their composition, manufacture and use. More particularly, the invention relates to these materials and their use for microvias and other printed circuit applications.

BACKGROUND OF THE INVENTION

Composites based on epoxy or cyanate esters and mixtures of such resins and organic or inorganic reinforcing materials have become extremely important in many technological areas and, in the PCB industry, they are considered as basic building blocks. Some of the major reasons for this include, first, the relatively simple and reliable processing of such resins and, second, the excellent mechanical and chemical properties of cured cyanate, bismaleimide and epoxy resin and their relative ease of adaptation to different applications.

Cyanate esters and blends with bismaleimides as well as epoxies in general are processed into composites and laminates primarily through the production of prepregs. For such production, organic or inorganic reinforcing materials or embedding components in the form of fibers, non-woven and woven fabrics are impregnated with the particular choice of resin. In most cases, this process is carried out using a solution of the resin in a single solvent or mixture of solvents that is relatively easy to evaporate during the prepregging operation. The resulting prepregs are tack-free and are bake processed to a level of advancement that will result in adequate flow in the subsequent lamination and consolidation stage to make the composite. The prepregs must have sufficient storage stability. For example, at least 180 days stability in storage is required for the production of circuit boards. In subsequent processing to produce circuit boards and laminates, the prepreg resin must also liquefy at elevated temperatures in the range of 100° to 160° C. and must be able to form a strong and durable bond under pressure with the reinforcing materials used for the laminate or circuit board In other words, the cross-linked resin matrix must have a high interfacial adhesion with the reinforcing materials as well as the materials to be bonded, such as treated or non treated surface of the metal conductors, cured laminates, inorganic fillers and other additives that constitute the laminate or circuit board. In other words, the cross-linked resin matrix must have a high interfacial adhesion with the reinforcing materials as well as the materials to be bonded, such as treated or non treated surface of the metal conductors, cured laminates, inorganic fillers and other additives that constitute the laminate or circuit board.

In electronic applications, the laminates are generally required to possess a wide range of favorable properties including high mechanical strength, good thermal stability, good chemical resistance, low heat distortion, a high resistance to aging, good electric insulation properties, consistent dimensional stability over a wide temperature range, good adhesion to glass and copper, a high surface resistivity, a low dielectric constant and loss factor, ease of drillability, low water absorption and a high corrosion resistance.

In addition, a key requirement that is governed by Underwriters' Laboratory (UL) is the ability to meet the flammability standard of UL 94-V0. In this test, a specimen is exposed to a defined flame positioned vertically at its lower edge. For a V0 rating, the total burning time in ten tests must not exceed 50 seconds and none of the samples can exceed 10 seconds of burn time. This requirement is difficult to meet especially when the material is thin, which is the case in electronics.

Epoxy resins alone or in combinations with cyanate esters or other additives, which are widely used in the electronic industry for PCB laminate applications, meet these requirements only because they contain approximately 30–40% brominated aromatic epoxy components, based on the resin or approximately 17% to 32% bromine (based on the total resin weight). In order for an electronic device to be marketed commercially, it is desirable for the device to equal or exceed certain flammability standards specified by UL. Antimony and halogen compounds have been added to resins in order to impart flame retardance, such as the 19%–23% by weight of bromine to make brominated polyglycidyl ether of bisphenol A in epoxy resin, which is described in U.S. Pat. No. 3,523,037, issued Aug. 4, 1970, to Chellis et al. High concentrations of halogenated compounds are used for other applications, often combined with antimony trioxide as a synergistic additive.

The problem with these brominated compounds is that, although they have excellent flame-retardant properties, they also have some undesirable properties. The chemical decomposition of aromatic bromine compounds release free bromine radicals and hydrogen bromide, which are highly corrosive. Additionally, when highly brominated aromatics decompose in the presence of oxygen, they may form the highly toxic brominated di-benzofurans as some past studies have shown. For this reason, interest in displacing the use of brominated aromatic epoxies has emerged in the electronic industry, primarily in Europe and Japan, where products including circuit boards having halogen-free epoxy resins are being designed and built. No attempts are currently being made by others to produce bromine- free or halogen-free cyanate esters/bismaleimide alone or in combination with epoxies for circuit board uses in the form of prepreg or resin coated copper formats for microvia technology.

Fillers with an extinguishing flame effect, such as antimony oxide, aluminum oxide hydrates, aluminum carbonates, magnesium hydroxides, borates and phosphates, have been proposed for the replacement of brominated aromatics. However, all these fillers have the disadvantage that they often seriously impair the mechanical, chemical and electrical properties of the laminates. In the case of antimony trioxide, it is listed as a carcinogen.

The flame-retardant effect of red phosphorus has also been investigated in some cases combined with finely divided silicon dioxide or aluminum oxide hydrate. Such compositions when used in electronic applications may produce corrosion problems due to the formation of phosphoric acid in the presence of moisture.

In addition, organic phosphorus compounds, such as phosphoric acid esters, phosphonic acid esters and phosphines, have been proposed as flame-retardant additives but these alternatives have not been very promising due to the plasticization effects that they may impart to the base resin.

SUMMARY OF THE INVENTION

The invention discloses a resin mixture comprising cyanate esters or triazines, with a bismaleimide, in combination with a derivative product from the reaction of a polyepoxy compound and a phosphorus-containing reactive organic compound for producing halogen free prepregs, laminates and composites, and also the halogen free prepregs and composites produced from these resin mixtures for uses such as microvia applications. The resin mixture is prepared by reacting in the presence of a polymerization catalyst such as an organometallic catalyst, a mixture of a cyanate ester monomer or prepolymer and a bismaleimide with the flame inhibiting compound. The resin mixture can also include an epoxy or a polyimide or both, added to the prepolymerized reaction mixture.

The invention also relates to a dielectric material and its method of preparation. The dielectric is free of halogen, and is composed of a resin mixture that comprises a) a cyanate ester monomer or prepolymer and a bismaleimide, and b) a derivative product from the reaction of a polyepoxy compound with at least one epoxy group per molecule, and a phosphorus-containing reactive organic compound. The compound is present in an amount wherein the elemental phosphorus content is between about 2% and about 20% based on the weight of the resin mixture. The resin mixture is polymerized using a catalyst, and optionally includes an epoxy, a polyimide and possible mixtures thereof. The catalyst typically is an organometallic compound. The phosphorus-containing reactive organic compound is selected from the group consisting of a phosphinic acid anhydride, a phosphonic acid anhydride and a phosphonic acid half-ester. Reinforcing materials, such as organic and inorganic fibers, as well as one or more coloring agents, fluorescent agents and UV absorbing components can optionally be added to the resin mixture.

The invention also relates to a prepreg and its manufacture. The prepreg comprises a resin mixture of a cyanate ester monomer or prepolymer; a bismaleimide monomer or prepolymer; a flame inhibiting compound consisting of a phosphorus-containing reactive organic compound prereacted with an epoxy monomer or prepolymer and present in an amount wherein the elemental phosphorus content is between about 2% and about 20% by weight, based on the weight of the resin mixture, and optionally, an epoxy monomer or prepolymer. The resin mixture also may contain organic or inorganic reinforcing materials in the form of fibers or woven or nonwoven fabrics, that are coated or impregnated with the resin mixture thus described The invention also covers a circuit board made of prepregs, produced from glass fiber fabrics and the resin mixture as described above.

The invention also relates to a resin coated article for use in microvia laser applications utilizing the halogen-free resin mixture as previously described.

Furthermore, the invention relates to a printed circuit board or organic chip carrier comprising internally a stabilized core made from the resin composition described above and built up of layers on either side of the stabilizing core made up from such resin composition.

The methods of making the circuit board, the resin coated article and the printed circuit board are also described.

DETAILED DESCRIPTION OF THE INVENTION

The curable resin composition of the present invention is selected from polyfunctional cyanate monomers, prepolymers thereof and prepolymers of cyanate monomers and epoxies.

The polyfunctional cyanate ester monomers that can be satisfactorily used in this curable resin composition are any organic compounds containing two or more, but preferably no more than five cyanate groups. These cyanate monomers are expressed by the general formula: R—(O—C N)$_n$ wherein n is a number typically between 2 and 5, and R is an aromatic group, with the cyanate group being bonded to the aromatic ring. Generally, these cyanate ester monomers can be prepared by a method which comprises reacting polyhydric phenols with cyanogen halides according to well known procedures.

The polyfunctional cyanate ester can also be used in the form of a prepolymer prepared by polymerizing the monomer under controlled heating. As a further alternative, the ester can be used as a mixture of the monomer and the prepolymer. The cyanate ester typically is present in the resin composition in an amount of between about 30% and about 80% by weight. More typically, it is present in an amount of between about 40% and about 60% by weight. Among the cyanate esters that are found to be useful in the practice of the present invention are 1,3 dicyanobenzene and 2,7-dicyano naphthalene;

The cyanate esters can be monomeric, or less preferably, polymeric including oligomers and can be represented by those materials containing the following groups:

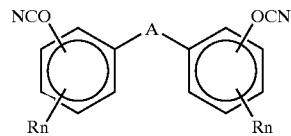

wherein A represents independently a single bond —C(CH$_3$)(H)—, —SO$_2$—, —O, —C(CF$_2$)$_2$—, —CH$_2$OCH$_2$—, —S—, —C(=O)—, —O—C(=O)—, —O—, —S(=O)—, —O—P(=O)—O—, —O—P(=O)(=O)—, divalent alkylene radicals such as —CH$_2$— and —C(CH$_3$)$_2$—; divalent alkylene radicals interrupted by heteroatoms in the chain such as O, S, and N.

Each R is independently selected from the group of hydrogen, or alkyl containing 1 to 9 carbon atoms:

Each n independently is an integer of 0 to 4.

Other cyanates useful in the method, composition and structure of the invention can be prepared by well known methods, for example, by reacting the corresponding polyvalent phenol with a halogenated cyanate, as described in U.S. Pat. Nos. 3,553,244; 3,740,348; and 3,755,402.

The phenol reactant can be any aromatic compound containing one or more reactive hydroxyl groups. The phenolic reactant is preferably a di or tri-polyhydroxy compound of the formula:

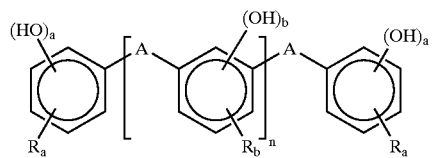

in which each a and b is independently 0, 1, 2 or 3, and at least one a is not 0; n is within the range of 0 to about 8, preferably 0 to 3; each R is independently selected from non-interfering allyl, aryl, alkaryl, heteroatomic, heterocyclic, carbonyloxy, carboxy, and the like ring substitutes, such as hydrogen, C$_{1-6}$ alkyl, C$_{1-6}$ ally, C$_{1-6}$ alkoxy, halogen, maleimide, propargyl ether, glycidyl ether and the like; and A is a polyvalent linking moiety which can be, for example, aromatic, aliphatic, cycloaliphatic, polycyclic, and heteroatomic. Examples of linking moiety A include —O—, —SO$_2$—, —CO—, —OCOO—, —S—, —C$_{1-12}$—, dicyclopendienyl, aralkyl, aryl, cycloaliphatic, and a direct bond.

Specific cyanate esters that can be employed in the present invention are available and well-known and include those discussed in U.S. Pat. Nos. 4,195,132; 3,681,292; 4,740,584; 4,745,215; 4,477,629; and 4,546,131; European patent application EP0147548/82; and German Offen. 2611796, disclosures of which are incorporated herein by reference.

Examples of cyanate ester include cyanatobenzene, dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane, 2,2-bis(3,5-dichloro 4-cyanatophenyl)propane, 2,2-bis(3.5-diblomo 4-dicyanatophenyl)propane; bis(4-cyanatophenyl) ether; bis(4-cyanatophenyl)thioether; bis(4-cyanatophenyl) sulfone; tris(4-cyanatopenyl)-phosphite; tris(4-cyanatophenyl)phosphate; bis(3-chloro-4-cyanatophenyl) methane; cyanated novolak derived from novolak cyanated disphenol type polycarbonate oligomer derived from bisphenol type polycarbonate oligomer and mixture thereof. These cyanate esters may be used as mixtures.

An example of a suitable polyaromatic cyanate ester containig cycloaliphatic bridging group between aromatic rings is available from Dow Chemical Company under the designation Dow XU-71787.00L cyanate. A preferred polyfunctional cyanate ester is Bisphenol A.D. dicyanate (4.4'-ethylidene-bisphenoldicyadate) available from Ciba-Giegy Corporation under the trade designation AROCY L-10, hexafluoro bisphenol A dicyanate (Arocy-40S), and bisphenol M dicyanate (RTX366), having the formula

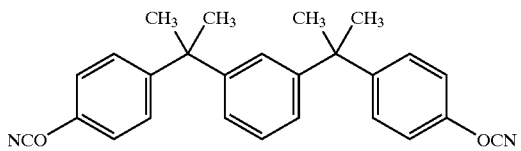

and commercially available from Vantico Corporation

The bismaleimides that are useful in the curable resin compositions of the present invention can be in the form of their prepolymers, alone or in combination with amines. The bismaleimides used in the invention are any organic compounds containing two maleimide groups and derived from the reaction of maleic anhydride with a diamine, preferably an aromatic or aliphatic diamine. These compounds are polymerized by heat alone or with catalysts. U.S. Pat. No. 4,644,039 describes the use of organophosphine and organophosphonium compounds as catalysts. Production of the monomers is described in numerous patents including U.S. Pat. Nos. 3,839,358 and 3,627,780. The bismaleimides typically are present in the resin composition in an amount of between about 3% and about 15% by weight. More preferably, they are present in an amount of between about 5% and about 10% by weight. Several of the bismaleimide compounds that can be used in the practice of the present invention are listed in U.S. Pat. Nos. 3,637,901 and 3,730, 948 and include N,N'-ethylene-bis-maleimide; N,N'-hexamethylene-bis-maleimide, N,N'metaphenylene-bis-maleimide; and N,N' dithiobis (N-phenylmaleimide. Processes for forming the bismaleimides from the diamines are well known in the art and are described in, for example, U.S. Pat. Nos. 3,839,287; 3,018,290; 4,376,206; 4,154,737; and 4,130.564.

The bismaleimide monomer can be any one of various bismaleimide resin monomers that are capable of undergoing polymerization reactions. It is comprised of two maleimide moieties that are joined by an appropriate divalent linking group. Such compounds are of the structure:

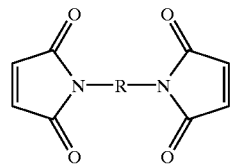

wherein R is a divalent linking group.

U.S. Pat. No. 4,714,726 to Katley lists a series of appropriate divalent linking groups that can be linked to the maleimide moiety at either end of the divalent linking groups. For this reason, the entire contents of U.S. Pat. No. 4,714,726 are herein incorporated by reference.

A particularly preferred bismaleimide monomer would be a monomer wherein the divalent linking group is a diphenylmethane group. The precursors of this bismaleimide monomer are readily available and, as such, this monomer is available from various manufacturers at economical prices. One such manufacturer is Vantico. Vantico 4,4'-bismaleimidodiphenylmethane is sold under the trade name of Matrimid 5292A.

Other suitable divalent linking groups for the bismaleimide monomer would include toluene substituted at its 2 and 4 positions with the maleimide moieties or a 2,2,3-trimethyl heptane substituted at the 1 and 5 positions of the maleimide moietv. Other bismaleimides might be as is described by Domeier, et al. in U.S. Pat. No. 4,691,025 the entire contents of which are also herein incorporated by reference.

The inclusion of an epoxy compound in the combination improves the adhesion of the resultant resin system to base materials. A particularly useful epoxy is one having at least one and preferably at least two epoxy groups per molecule, and a high molecular weight of at least about 1,600 g/mole. These epoxy compounds are commonly prepared by the reaction of a polyhvdric phenol with an epihalohydrin, such as epichlorohydrin, in the presence of an inorganic base. The epoxy compound typically is present in the resin composition in an amount of between about 20% and about 70% by weight. More preferably, it is present in an amount of between about 40% and about 60% by weight. Epoxy constituents include epoxy resins which contain one or more epoxy groups having the following formula:

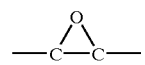

The epoxy groups can be terminal epoxy groups or internal epoxy groups. The epoxides are of two general types: polyglycidyl compounds or products derived from epoxidation of dienes or polyenes. Polyglycidyl compounds contain a plurality of 1,2-epoxide groups derived from the reaction of a polyfunctional active hydrogen containing compound with an excess of an epihalohydrin under basic conditions. When the active hydrogen compound is a polyhydric alcohol or phenol, the resulting epoxide resin contains glycidyl ether groups. A preferred group of polyglycidyl compounds are made via condensation reactions with 2,2-bis(4-hydroxyphenyl)propane, also known as bisphenol A, and have structures such as

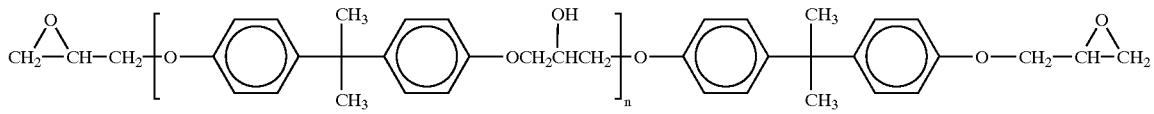

where n has a value from about 0 to about 15. These epoxides are bisphenol-A epoxy resins which are condensation products of bisphenol A and epichlorohydrin.

Those no-brominated resins having an average epoxy equivalent, preferably of from 150 to 1,000, more preferably from 300 to 600, are used. (The ratio of the molecular weight of the resin to the number of epoxy groups in the molecule is simply referred to as an epoxy equivalent). The heat resistance of bisphenol A type epoxy resins having an epoxy equivalent more than about 1,000 is somewhat low. Illustrative bisphenol A type epoxy resins include Epikote 828, 834, 817, 1001, 1002, 1004, 1007, and 1009 (Shell Chemicals Corp.), Araldite CY 205, 230, 232 and 221, GY 257, 252, 255, 250, 260 and 280, Araldite 6071, 7071 and 7072 (Ciba-Geigy Corporation), Dow Epoxy DER 331, 332, 662, 663U and 662U (Dow Chemical Company), Epicron 840, 850, 855, 860, 1050, 3050, 4050 and 7050 (Dainippon Iri Kagaku Kogyo Co.), and Epototo YD-115, 115-CA, 117, 121, 127, 128, 128CA, 128 S, 134,001Z,011, 012,014, 014 ES, 017, 019, 020 and 002 (Toto Kasei Co.).

Polyepoxides which are polyglycidyl ethers of 4,4'-dihydroxydiphenyl methane, 4,4'-dihydroxydiphenyl sulfone, 4,4'-biphenol, 4,4'-dihydroxydiphenyl sulfide, phenolphthalein, resorcinol, 4,2'-biphenol, or tris(4-hydroxyphenyl)methane and the like, are useful in this invention. In addition, EPON 1031 (a tetraglycidyl derivative of 1,1,2,2-tetrakis(hydroxyphenyl)ethane from Shell Chemical Company), and Apogen 101, (a methylolated bisphenol A resin from Schaefer Chemical Co.) may also be used.

Other suitable epoxy resins include polyepoxides prepared from polyols such as pentaerythritol, glycerol, butanediol or trimethylolpropane and an epihalohydrin.

Polyglycidyl derivatives of phenol-formaldehyde novolaks where n=0.1 to 8 and cresol-formaldehyde novolaks where n=0.1 to 8 are also usable. The former are commercially available as D.E.N. 431,438,439 and 485 from Dow Chemical Company. The latter are available as, for example, ECN 1235, 1275, 1280 and 1299 (obtained from Vantico Corporation). Other epoxidized novolaks, such as SU-8 (Shell Chemical) EOCN 102, 103 and 104 manufactured by Nippon Kayaku Co., are also suitable.

Other polyfunctional active hydrogen compounds besides phenols and alcohols may be used to prepare the polyglycidyl adducts of this invention. They include amines, amino alcohols and polycarboxylic acids.

Adducts derived from amines include N,N-diglycidyl aniline, N,N-diglycidyl toluidine, N,N,N,N'-tetraglycidylxylylene diamine; N,N,N',N'-tetraglycidyl-bis (methylamino) cyclohexane; N,N,N,N'-tetraglycidyl-4,4'-diaminodiphenyl methane, N,N,N,N'-tetraglycidyl-3,3'-diaminodiphenyl sulfone, and N,N'-dimethyl-N,N'-diglycidyl-4,4'-diaminodiphenyl methanes. Commercially available resins of this type include Glyamine 135 and Glyamine 125 (obtained from F.I.C. Corporation, San Francisco, Calif.), Araldite MY-720 (obtained from Vantico Corporation) and PGA-X and PGA-C (obtained from The Sherwin-Williams Co., Chicago, Ill.).

Suitable polyglycidyl adducts derived from amino alcohols include O,N,N-triglycidyl-4-aminophenol, available as Araldite 0500 or Araldite 0510 and O,N,N-triglycidyl-3-aminophenol (available as Glyamine 115 from F.I.C. Corporation).

Also suitable for use herein are the glycidyl esters of carboxylic acids. Such glycidyl esters include, for example, diglycidyl phthalate, diglycidyl terephthalate, diglycidyl isophthalate, and diglycidyl adipate. There may also be used polyepoxides, such as triglycidyl cyanurates and isocyanurates, N,N-diglycidyl oxamides, N,N'-diglycidyl derivatives of hydrantoins, such as "XB 2793" (obtained from Vantico Corporation), diglycidyl esters of cycloaliphatic dicarboxylic acids, and polyglycidyl thioethers of polythiols.

Other epoxy-containing materials are copolymers of acrylic acid esters of glycidol such as glycidyl acrylate and glycidyl methacrylate with one or more copolymerizable vinyl compounds. Examples of such copolymers are 1:1 styrene-glycidyl methacrylate 1:1 methylmethacrylate-glycidyl acrylate and 62.5:24:13.5 methyl methacrylate-:ethyl acrylate:glycidyl methacrylate.

Silicone resins containing epoxy functionality, e.g., 2,4, 6,8,10-pentakis [3-(2,3-epoxypropoxy) propyl]-2,4,6,8,10-pentamethylcyclopentasiloxane and the diglycidyl ether of 1,3-bis-(3-hydroxypropyl)tetramethyldisiloxane), are also usable.

Particularly suitable epoxy resins include, for example, the diglycidyl ethers of resorcinol, catechol, hydroquinone, biphenol, bisphenol A. tetrabronobisphenol A. phenolaldehyde novolac resins, alkyl substituted phenol-aldehyde resins, bisphenol F. tetramethylbiphenol, tetramethyltetrabromophenol, tetramethyltetrabromophenol, tetrachlorobisphenol A, combination thereof, and the like.

The second group of epoxy resins is prepared by epoxidation of dienes or polyenes. Resins of the type include bis(2,3 epoxycyclopentyl)ether, reaction products thereof with ethylene glycol which are described in U.S. Pat. No. 3,398,102, 5(6)-glycidyl-2(1,2-epoxyethyl)bicyclo[2,2,1] heptane, and dicyclopentadiene diepoxide. Commercial examples of these epoxides include vinylcyclohexene dioxide, e.g., "ERL-4206" (obtained from Union Carbide Corp.), 3,4-epoxycyclohexylmethyl 3,4-epoxycyclohexane carboxylate, e.g., "ERL-4221" (obtained from Union Carbide Corp.), 3,4-epoxy-6-methylcyclohexylmethyl 3,4-epoxy-6-methylcyclohexane carboxylate, e.g., "ERL-4201" (obtained from Union Carbide Corp.), bis(3.4-epoxy-6-methylcyclohexylmethyl) adipate, e.g., "ERL-4289" (obtained from Union Carbide Corp.), dipentene dioxide, e.g., "ERL-4269" (obtained from Union Carbide Corp.), 2-(3,4-epoxycyclohexyl-5,5-spiro-3,4-epoxy) cyclohexamemetadioxane, e.g., "ERL-4234" (obtained from Union Carbide Corp.) and epoxidized polybutadiene, e.g., "Oxiron 2001" (obtained from FMC Corp.)

Other suitable cycloaliphatic epoxides include those described in U.S. Pat. Nos. 2,750,395; 2,890,194; and 3,318, 822 which are incorporated herein by reference.

The flame inhibiting component of the mixture is a phosphorus-containing reactive compound. The compound preferably but not necessarily is selected from the group consisting of a phosphinic acid anhydride, a phosphonic acid anhydride and a phosphonic acid half-ester. The amount of the phosphorus in the flame retardant component is typically between about 2% and about 20% by weight of the resin mixture. More specifically, the phosphorus content is between about 2% and 15% by weight of the resin mixture. Specific examples of the flame inhibiting phosphorus-containing compounds useful in this invention to modify the epoxides include:

Phosphinic acid anhydrides, such as dimethyl phosphinic acid anhydride, methylethyl phosphinic acid anhydride, diethyl phosphinic acid anhydride, dipropyl phosphinic acid anhydride, ethylphenyl phosphinic acid anhydride and phosphinic acid anhydride; alkane-bis-phosphinic acid anhydrides; methane-1,1-bis-methyl-phosphinic acid anhydride, ethane-1, 2-bis-methyl phosphinic acid anhydride, ethane-1,2-bis-phenyl phosphinic acid anhydride and butane-1,4-bis-methyl phosphinic acid anhydride;

Phosphonic acid anhydrides including methanephosphonic acid anhydride, ethanephosphonic acid anhydride, propanephosphonic acid anhydride, hexanephosphonic acid anhydride, and benzenephosphonic acid anhydride;

Phosphonic and phosphinic acid alkyl esters such as ethane phosphonic acid diethyl ester, methane phosphonic acid dimethyl ester, n-propane phosphonic acid di-n-propyl ester, butane phosphonic acid dibutyl ester, pentane phosphonic acid dipentyl ester, octane phosphonic acid dioctyl ester, ethane phosphonic acid dimethyl ester, i-propane phosphonic acid dimethyl ester, i-butane phosphonic acid dimethyl ester, cyclohexane phosphonic acid dimethyl ester, dodecane phosphonic acid dimethyl ester, 2-methoxyethane phosphonic acid dimethyl ester vinyl phosphonic acid dimethyl ester, allyl phosphonic acid dimethyl ester, benzene phosphonic acid dimethyl ester, diphenyl phosphinic acid dimethyl ester, and dimethyl phosphinic acid methyl ester.

The epoxy resin mixtures according to this invention may also contain accelerators, which are known to play an important role in curing epoxy resins. Tertiary amines or imidazoles are generally used. Suitable amines include, for example, tetramethylethylenediamine, dimethyloctylamine, dimethylaminoethanol, dimethylbenzylamine, 2,4,6-tris (dimethylaminomethyl)-phenol, N,N'-tetramethyl-diamino-diphenylmethane, N,N'-diamethylpiperazine, N-methylmorpholine, N-methymorpholine, N-methylpiperidine, N-ethylpyrrolidine, 1,4-diazabicyclo(2, 2,2)-octane and quinolines. Suitable imidazoles include, for example, 1-methylimidazole, 2-methylimidazole, 1,2-dimethylimidazole, 1,2,4,5-tetramethylimidazole, 2-ethyl-4-methylimidazole, 1-cyanoethyl-2-phenylimidazole and 1-(4, 6-diamino-s-triazinyl-2-ethyl)-2-phenylimidazole. The accelerators are added in a concentration of 0.01 to 2 wt %, preferably 0.05 to 1%, each based on the epoxy resin mixture.

The resin composition of the present invention may contain a reinforcing agent or filler in a fibrous or powdered form. Examples of powdered reinforcing agents are inorganic powders, such as crystalline or amorphous glass, silica, calcined clay, magnesium silicate, diatomaceous earth, alumina, calcium carbonate, magnesia, kaolin and mica. Examples of useful fibrous reinforcements are inorganic fibers, such as ceramic fibers, asbestos, rock wool, glass fibers, slag wool, cotton fibers and synthetic fibers such as polyimide fibers and fibers made from the composition of the present invention. These reinforcing materials may be used in an amount up to 65% by weight of the resin mixture.

An organometallic compound is used to catalyze the reaction between the cyanate and/or bismaleimide resin precursor and the phosphorus-containing component. Among the organometallic catalysts that are suitable for use as the catalyst are the metal salts, such as lead naphthenate, lead stearate, zinc naphthenate, zinc octanoate, tin oleate, dibutyl tin maleate, manganese naphthenate, cobalt naphthenate and the lead salt of resin acid. The catalyst is used in an amount sufficient to promote the covalent reaction. This can be in the range of between about 0.0002% and about 2% by weight of the resin mixture. More preferably, it is present in an amount of between about 0.0002% and about 0.0004% by weight.

The following examples show typical manner of preparing the prepregs according to the present invention, but are not intended, nor should they be construed as a limitation in the scope of the invention.

EXAMPLE 1

The preparation of a phosphorous containing polyepoxide to make a prepreg is described as follows:

125 grams of a bisphenol A epoxy resin (Epon 828 from Shell Chemical) were stirred at 40° C. in a bottom round flask equipped with a reflux condenser, a stirrer and thermometer. To this 140 grams of propane phosphonic anhydride in ethyl acetate (50% solution) were added dropwise in the course of 90 minutes. The mixture was subsequently stirred for one hour and thereafter kept under reflux for 12 hours.

EXAMPLE 2

One hundred (100) grams of a bisphenol A epoxy resin (Epon 828 from Shell Chemical) and about 64 grams of ethyl-methyl-phosphinic anhydride were stirred at −40° C. for about 6 hours. An additional 40 grams of ethyl-methylphosphinic anhydride were added and the mixture was subsequently stirred at 150° C. for an additional 12 hours. After cooling, a 72% solution was prepared with methyl ethyl ketone.

EXAMPLE 3

The following procedure is used for a varnish and prepreg preparation. A) A mixture containing 65 grams of a bismaleimide-triazine resin (70% solids by wt. in methyl ethyl ketone, [MEK]), 80 grams of the epoxy product made by example 2 (72% solids by wt in MEK), 7 grams of Epon 1031 (Shell Chemical), 0.3 grams of Orasol Black (Ciba) and 0.03 phr (arts per 100 parts of resin) zinc octanoate was made and allowed to stabilize at room temperature for about 2 hours before use. B) Glass fabric (1080 cloth style) was impregnated with the solution above using a laboratory impregnating unit, air dried and b-staged at 150° C. for about 4 minutes. A prepreg having resin content of 60% by weight and flow of about 30%, and prepreg gel time of about 120 seconds was obtained.

EXAMPLE 4

The prepreg of example 3 is dried until it is substantially tack free, and is then sandwiched between two thin sheets of conductive metal such as copper, each having a thickness of between about 0.5 and 1.4 mils. Copper sheets are typically supplied for this purpose with one side being roughened and treated so as to improve the bonding strength with the prepreg. This sandwich is then laminated, preferably under heat and pressure. This is followed by forming a circuit on the exposed copper surfaces by suitable means such as photo lithography, and the formation of plated through holes to form a sub assembly. Several of these sub assemblies can then be laminated together to form a composite through which more holes may be drilled to form interconnections between layers.

While the invention has been described in combination with embodiments thereof, it is evident that many alternatives, modifications, and variations will be apparent to those skilled in the art in light of the foregoing teachings. Accordingly, the invention is intended to embrace all such alternatives, modifications and variations as fall within the spirit and scope of the appended claims.

What is claimed is:

1. A resin mixture, free of halogen, comprising the catalyzed product of a reaction mixture of:
   a) a cyanate ester monomer or prepolymer and a bismaleimide,
   b) a flame inhibiting compound comprising a derivative product from the reaction of a polyepoxy compound with at least one epoxy group per molecule with a phosphorus-containing reactive organic compound selected from the group consisting of a phosphinic acid anhydride, a phosphonic acid anhydride and a phosphonic acid half-ester, present in an amount wherein the elemental phosphorus content is between about 2% and about 20% by weight, based on the weight of the resin mixture, wherein the resin mixture is polymerized using a catalyst.

2. The resin mixture according to claim 1 further including an epoxy or a polyimide or mixtures thereof added to the reaction mixture before polymerization.

3. The resin mixture according to claim 1 wherein an organometallic compound is used as the polymerization catalyst.

4. The resin mixture according to claim 1 further including one or more of the following: a coloring agent present in the mixture in the range of 0% to about 2%, a fluorescent agent present in the range of 0% to about 6% and a UV absorbing component present in the range of 0% to about 6%, all based on the weight of the resins.

5. The resin mixture according to claim 1 further including reinforcing materials selected from the group consisting of organic or inorganic fibers, woven fabrics and nonwoven fabrics present in an amount of between about 20% and about 60% by weight.

6. The resin mixture of claim 3 wherein the organometallic catalyst is present in an amount of between about 0.0001% and about 0.01% by weight based on the weight of the mixture.

7. The resin mixture according to claim 1 wherein the cyanate ester is selected from the group consisting of cyanatobenzene, dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane; 2,2-bis(3,5-dichloro 4-cyanatophenyl)propane; 2,2-bis(3,5-diblomo 4-dicyanatophenyl)propane; bis(4-cyanatophenyl)ether; bis(4-cyanatophenyl)thioether; bis(4-cyanatophenyl)sulfone; tris(4-cyanatophenyl)-phosphite; tris(4-cyanatophenyl)phosphate; bis(3-chloro-4-cyanatophenyl)methane; cyanated novolak derived from novolak cyanated disphenol type polycarbonate oligomer derived from bisphenol type polycarbonate oligomer and mixture thereof and is present in an amount of between about 30% and about 80% by weight of the mixture.

8. The resin mixture according to claim 1 wherein the bismaleimide is present in an amount of up to about 15% by weight of the mixture, and has the following structure:

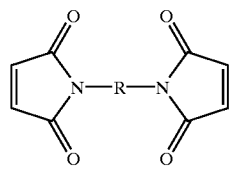

wherein R is a divalent linking group.

9. The resin according to claim 2 wherein the epoxy is selected from the group including the diglycidyl ethers of resorcinol, catechol, hydroquinone, biphenyl, bisphenol A, tetrabromobisphenol A, phenolaldehyde novolac resins, alkyl substituted phenol-aldehyde resins, bisphenol F, tetramethylbiphenol, tetramethyltetrabromophenol, tetrachlorobisphenol A, and combination thereof.

10. A method of preparing a resin mixture, fee of halogen, comprising reacting in the presence of an organometallic polymerization catalyst, a mixture of a cyanate ester monomer or prepolymer and a bismaleimide with a flame inhibiting compound comprising a derivative product from the reaction of a polyepoxy compound with at least one epoxy group per molecule with a phosphorus-containing reactive organic compound present in an amount wherein the elemental phosphorus content is between about 2% and about 20% by weight, based on the weight of the resin mixture.

11. The method of preparing the resin mixture according to claim 9 further including an epoxy or a polyimide or mixtures thereof to the reaction mixture.

12. A halogen-free dielectric material formed by the catalytic polymerization of a cyanate ester monomer or prepolymer, a bismaleimide and a flame inhibiting derivative comprising the reaction product of a polyepoxy compound having at least one epoxy group and an amount of a phosphorus-contang reactive organic compound selected from the group consisting of a phosphinic acid anhydride, a phosphonic acid anhydride and a phosphonic acid half-ester present in an amount wherein the elemental phosphorus content is between about 2% and about 20% by weight, based on the weight of the resin mixture.

13. The dielectric material according to claim 12 wherein an organometallic compound is used as the polymerization catalyst.

14. The dielectric material according to claim 12 further including at least one additional component selected from the group consisting of a coloring agent, a fluorescent agent and a UV absorbing agent.

15. The dielectric material according to claim 12 further including reinforcing materials selected from the group consisting of organic or inorganic fibers, woven fabrics and nonwoven fabrics present in an amount of between about 20% and about 60% by weight.

16. The dielectric material according to claim 12 wherein the cyanate ester is selected from the group consisting of cyanatobenzene, dicyanatobenzene; 1,3,5-tricyanatobenzene; 1,3-, 1,4-, 1,6-, 1,8-, 2,6- or 2,7-dicyanatonaphthalene; 1,3,6-tricyanatonaphthalene; 4,4'-dicyanatobiphenyl; bis(4-cyanatophenyl)methane; 2,2-bis(4-cyanatophenyl)propane; 2,2-bis(3,5-dichloro 4-cyanatophenyl)propane; 2,2-bis(3,5-dibromo 4-dicyanatophenyl)propane; bis(4-cyanatophenyl)ether; bis(4-cyanatophenyl)thioether; bis(4-cyanatophenyl)sulfone; tris(4-cyanatophenyl)-phosphite; tris(4-cyanatophenyl)phosphate; bis(3-chloro-4-cyanatophenyl)methane; cyanated novolak derived from novolak cyanated disphenol type polycarbonate oligomer derived from bisphenol type polycarbonate oligomer and mixture thereof and is present in an amount of between about 30% and about 80% by weight of the mixture.

17. The dielectric material according to claim 12 wherein the bismaleimide is present in an amount of up to about 15% by weight of the mixture, and has the following structure:

wherein R is a divalent linking group.

18. The dielectric material according to claim 12 wherein the epoxy is selected from the group including the diglycidyl ethers of resorcinol, catechol, hydroquinone, biphenol, bisphenol A; tetrabromobisphenol A; phenolaldehyde novolac resins, alkyl substituted phenol-aldehyde resins, bisphenol F; tetramethylbiphenol, tetramethyltetrabromophenol, tetrachlorobisphenol A, and combination thereof.

19. The method of forming a halogen-free dielectric material by the polymerization of a cyanate ester monomer or prepolymer, a bismaleimide and a flame inhibiting derivative comprising the reaction product of a polyepoxy compound having at least one epoxy group and an amount of a phosphorus-containing reactive organic compound selected from the group consisting of a phosphinic acid anhydride, a phosphonic acid anhydride and a phosphonic acid half-ester present in an amount wherein the elemental phosphorus content is between about 2% and about 20% by weight, based on the weight of the resin mixture in the presence of an organometallic polymerization catalyst.

20. A prepreg comprising the resin mixture formed by the catalytic reaction of
a) a cyanate ester monomer or prepolymer;
b) a bismaleimide monomer or prepolymer; and
c) a flame inhibiting compound consisting of a phosphorus-containing reactive organic compound pre-reacted with an epoxy monomer or prepolymer wherein the elemental phosphorus content is between about 2% and about 20% by weigh based on the weight of the resin mixture, to which is admixed a reinforcing material comprising organic or inorganic fillers or woven or non woven fabrics, wherein the phosphorus-containing compound is selected from the group consisting of a phosphinic acid anhydride, a phosphonic acid anhydride and a phosphonic acid half-ester.

21. The prepreg according to claim 20 wherein the cyanate ester monomer or prepolymer is present therein in an amount of between about 30% and about 80% by weight and the bismaleimide is present in an amount up to about 15% by weight.

22. The prepreg according to claim 20 wherein the reinforcing material comprises woven or non-woven fabrics of glass fibers.

23. The prepreg according to claim 20 further including one or more of the following: a coloring agent present in the range of 0% to about 6%, a fluorescent agent present in the range of 0% to about 6% and a UV absorbing component present in the range of 0% to about 6% all based on the weight of the prepreg.

24. A method of preparing a prepreg comprising reacting
a) a cyanate ester monomer or prepolymer;
b) a bismaleimide monomer or prepolymer; and
c) a frame inhibiting compound consisting of a phosphorus-containing reactive organic compound selected from the group consisting of a phosphinic acid anhydride, a phosphonic acid anhydride and a phosphonic acid half-ester pre-reacted with an epoxy monomer or prepolymer and present in an amount wherein the elemental phosphorus content is between out 2% and about 20%o by weight, based on the weight of the resin mixture, in the presence of a polymerization catalyst, and applying the reaction product with a reinforcing material comprising organic or inorganic fillers or woven or non woven fabrics.

25. The method according to claim 24 wherein the cyanate ester monomer or prepolymer is present in the reaction mixture in an amount of between about 30% and about 80% by weight and the bismaleimide is present in an amount of less than about 15% by weight.

26. The method according to claim 24 further including an epoxy monomer or prepolymer in the reaction mixture.

27. The method according to claim 24 wherein the reinforcing material comprises woven or non-woven fabrics comprised of glass fibers.

28. A circuit board made from a fiberglass fabric impregnated with a prepreg prepared from the catalyzed reaction of
a) a cyanate ester monomer or prepolymer;
b) a bismaleimide monomer or prepolymer; and
c) a flame inhibiting compound consisting of a phosphorus-containing reactive organic compound selected from the group consisting of a phosphinic acid anhydride, a phosphonic acid anhydride and a phosphonic acid half-ester pre-reacted with an epoxy monomer or prepolymer and present m an amount wherein the elemental phosphorus content is between about 2% and about 20% by weight, based on the weight of the reaction mixture, to which is admixed a reinforcing material comprising organic or inorganic fillers or woven or non woven fabrics.

29. The circuit board according to claim 28 wherein an organometallic catalyst is used to catalyze the reaction mixture.

30. The circuit board according to claim 28 wherein the prepreg further includes a coloring agent in the range of 0% to about 2%, a fluorescent agent in the range of 0% to about 6% and a UV absorbing component in the range of 0% to about 6% all based on the weight of the resins.

31. The circuit board according to claim 28 wherein the cyanate ester monomer or prepolymer is present in the prepreg in an amount of between about 30% and about 80% by weight and the bismaleimide is present in an amount up to about 15% by weight.

32. The method of making a circuit board from a glass fiber fabric impregnated with a prepreg comprising the steps of
a) preparing in the presence of a polymerization catalyst, a reaction mixture of a cyanate ester monomer or prepolymer; a bismaleimide monomer or prepolymer; and a flame inhibiting compound consisting of a phosphorus-containing reactive organic compound selected from the group consisting of a phosphinic acid anhydride, a phosphonic acid anhydride and a phosphonic acid half-ester and is pre-reacted with an epoxy monomer or prepolymer and present in an amount wherein the elemental phosphorus content is between about 2% and about 20% by weight, based on the weight of the reaction mixture, b) applying the reaction mixture to a reinforcing material comprising organic or inorganic fillers or woven or non woven fabrics to form a coated sheet of reinforcing material, c) curing the sheet of coated reinforcing material until the sheet is substantially tack free, and d) laminating a conductive metal layer to each surface of the sheet.

33. The method according to claim 32 wherein an organometallic catalyst is used to catalyze the reaction mixture.

34. A resin impregnated article comprising a substrate, and a layer of a polymerized resin prepared by the catalytic reaction of a) a cyanate ester monomer or prepolymer;

b) a bismaleimide monomer or prepolymer; and c) a flame inhibiting compound consisting of a phosphorus-containing reactive organic compound selected from the group consisting of a phosphinic acid anhydride, a phosphonic acid anhydride and a phosphonic acid half-ester pre-reacted with an epoxy monomer or prepolymer, present in an amount wherein the elemental phosphorus content is between about 2% and about 20% by weight, based on the weight of the polymerized resin, applied to a reinforcing material comprising organic or inorganic fillers or woven or non woven fabrics.

35. The article according to claim 34 comprising of a stabilized core containing at least one metal layer laminated to either side of the core.

36. The article according to claim 34 wherein the cyanate ester monomer or prepolymer is used to prepare the polymerized resin and is present in an amount of between about 30% and about 80% by weight and the bismaleimide is present in an amount up to about 15% by weight.

37. The article according to claim 34 wherein an organometallic catalyst is used to catalyze the resin.

38. The article according to claim 34 wherein the reaction mixture includes an epoxy monomer or prepolymer and/or a polyimide.

39. The article according to claim 34 useful in a microvia single or multi-layer circuit board.

40. A method of preparing a resin coated article composed of a substrate and a polymerized resin comprising the steps of a) catalytically reacting a mixture of
1) a cyanate ester monomer or prepolymer;
2) a bismaleimide monomer or prepolymer; and
3) a flame inhibiting compound consisting of a phosphorus-containing reactive organic compound pre-reacted with an epoxy monomer or prepolymer, present in an amount wherein the elemental phosphorus content is between about 2% and about 20% by weight, based on the weight of the polymerized resin, and b) impregnating a reinforcing material composed of organic or inorganic fillers or woven or non woven fabrics with the reaction mixture.

41. The method according to claim 40 wherein a metal layer is laminated to the impregnated reinforcing material to form a stabilized core.

* * * * *